United States Patent [19]

Tsuzuki et al.

[11] Patent Number: 5,679,176
[45] Date of Patent: Oct. 21, 1997

[54] GROUP OF SOLAR CELL ELEMENTS, AND SOLAR CELL MODULE AND PRODUCTION METHOD THEREOF

[75] Inventors: Koji Tsuzuki, Tsuzuki-gun; Katsuhiko Inoue, Nara; Takeshi Takada; Yoshifumi Takeyama, both of Tsuzuki-gun, all of Japan

[73] Assignee: Canon Kabushiki Kaisha, Tokyo, Japan

[21] Appl. No.: 551,533

[22] Filed: Nov. 1, 1995

[30] Foreign Application Priority Data

Nov. 4, 1994 [JP] Japan .................. 6-271627

[51] Int. Cl.$^6$ .................. H01L 31/05; H01L 31/048; H01L 31/18
[52] U.S. Cl. .................. 136/251; 136/244; 437/2
[58] Field of Search .................. 136/244, 251; 437/2–5, 205, 207, 209

[56] References Cited

U.S. PATENT DOCUMENTS

| | | | |
|---|---|---|---|
| 4,370,509 | 1/1983 | Dahlberg | 136/244 |
| 4,443,652 | 4/1984 | Izu et al. | 136/251 |
| 5,296,043 | 3/1994 | Kawakami et al. | 136/244 |

FOREIGN PATENT DOCUMENTS

| | | | |
|---|---|---|---|
| 0048830 | 10/1982 | European Pat. Off. | H01L 31/02 |
| 4104713 | 8/1991 | Germany | H01L 31/048 |
| 58-134481 | 8/1983 | Japan | 136/244 |

OTHER PUBLICATIONS

Patent Abstracts of Japan, vol. 012, No. 013 (E–573), Jan. 14, 1988 & JP–A–62 173768 (Sharp Corp), Jul. 30, 1987.

Primary Examiner—Aaron Weisstuch
Attorney, Agent, or Firm—Fitzpatrick, Cella Harper & Scinto

[57] ABSTRACT

A group of solar cell elements is obtained by connecting a plurality of solar cell elements in series or in parallel by metal foil members, which is characterized in that an insulating tape is adhered in parallel with the metal foil members on and across the back surfaces of the plurality of solar cell elements arranged next to each other. The insulating tape is characterized by comprising a base member of a resin, for example polyethylene terephthalate (PET). A solar cell module is characterized in that the above group of solar cell elements is covered with a polymeric organic resin. Further, a method for producing the solar cell module comprises a step of adjacently arranging a plurality of solar cell elements, a step of adhering an insulating tape on the back surfaces of the plurality of solar cell elements, a step of connecting the plurality of solar cell elements in series or in parallel by metal foil members, and a step of covering the elements with a polymeric organic resin.

13 Claims, 6 Drawing Sheets

REPEATED BENDING CYCLES

5,679,176

GROUP OF SOLAR CELL ELEMENTS, AND SOLAR CELL MODULE AND PRODUCTION METHOD THEREOF

BACKGROUND OF THE INVENTION

1. Field of the Invention

The present invention concerns a group of solar cell elements, a solar cell module, and a production method thereof. More particularly, the invention relates to a group of solar cell elements, wherein strips of insulating tape are adhered in parallel with metal foil members on and across the back surfaces of solar cell elements arranged next to each other, and to a solar cell module and a production method thereof.

2. Related Background Art

Thermal power generation, which heretofore has been a major source of power supply, includes problems such as global warming. Therefore, recent demands have been made to attain an energy source with a lesser amount of $CO_2$ emission. On the other hand, nuclear power generation, without emission of $CO_2$, involves significant environmental pollution due to radioactive substances. Thus rapid development of a nonpolluting and safe energy source is demanded.

Among prospective clean energy sources, solar cells are particularly drawing much attention in terms of their non-polluting nature, safety, and ease of handling.

Among various types of solar cells, amorphous silicon solar cells are inferior in conversion efficiency to crystalline silicon solar cells, but they have excellent features that cannot be obtained with the crystalline silicon solar cells. For example, crystalline silicon solar cells possess ease of construction of a large-area cell and capability of operating in a thin film form because of a large optical absorption coefficient, and is one of the most promising types of solar cell.

Normally, solar cell arrays and modules often use a plurality of solar cell elements connected in series, because a single solar cell element cannot supply a sufficient output voltage. Further, parallel connection of solar cell elements with each other is employed in order to increase the output of electric current, and there are some arrays which employ both series connection and parallel connection.

FIGS. 7A–7C are schematic drawings of series connection in a conventional solar cell module. FIG. 7A shows a state before series connection and FIG. 7C shows a state after series connection. Further, FIG. 7B is a cross section taken along 7B—7B in FIG. 7A.

In FIGS. 7A–7C, reference numeral 700 designates solar cell elements, in each of which a lower electrode layer 702, a semiconductor layer 703, and an upper electrode layer 704 are formed in the stated order on a substrate 701.

Each of these solar cell elements 700 is formed so that parts (705) of the upper electrode layer 704 are removed in order to achieve perfect electrical separation between the upper electrode 704 and the lower electrode 702. Thereafter a collector electrode 706, which is a collecting electrode of the upper electrode 704, is formed, and a bus-bar electrode 707, which is a further collecting electrode of the collector electrode 706, is mounted on the collector electrode 706, and the collector electrode 706 and bus-bar electrode 707 are electrically connected with each other with a conductive adhesive 708, thus obtaining an output electrode from the upper electrode 704.

In order to make good electrical separation between the bus-bar electrode 707 and the substrate 701, insulating tape 709 is provided between the ends of a solar cell element 700 and the bus-bar electrode 707. Strips of insulating tapes 709 are adhered so as to cover places (particularly, edge portions at the ends of the elements) where series connection members to be later connected to the bus-bar electrodes 707 could touch the lower electrodes 702, thereby ensuring electrical separation.

Next, electrical contact to the lower electrodes 702 is achieved as follows. For later series connection, portions 710 are exposed by a mechanical method at portions of the conductive substrate 701 in each solar cell element 700. After that, connecting members 720 are placed, as shown in FIG. 7C, so as to overlap the bus-bar electrode 707 of one solar cell element 700 and the exposed portions 710 of the lower electrode of an adjacent solar cell element 700, and the overlapped portions are connected in series by soldering.

Finally, a group of solar cell elements 700 thus connected in series are sealed with a filler material of ethylene-vinyl acetate (EVA) as a protection material, thus completing a solar cell module.

However, solar cell modules require great care in handling, for example when a number of solar cell elements are connected in series therein, though no trouble occurs in the case of a solar cell module with three-serially connected cells as in the illustrated example, i.e., a module in which only three solar cell elements are connected in series.

In more detail, when a group of elements is moved in a production line to the next step after completion of series connection or when the group of elements is turned over for leading the output terminals out from the back face, the most stress is placed on the connecting members 720 during handling of the group, resulting in raising the following problems.

(1) Since the connecting members 720 are firmly connected to the bus-bar electrodes 707, the stress is transferred to the bus-bar electrodes 707. If the stress should become greater than the strength of the conductive adhesive 708, the bus-bar electrode 707 can be peeled off from the solar cell element.

(2) The stress can bend a connecting member 720 and form a crease in the connecting member 720. As a result, when repeated bending stress is imposed on the solar cell module, the stress is concentrated on the creased portion, which will eventually be broken.

If the connecting members 720 are made of a strong material that can stand the stress, they could be free of the above-described problems. However, the connecting members 720 will have a significant thickness in this case. This raises another problem that bubbles are formed in step portions of the connecting members when the solar cell elements 700 are sealed with the filler material later on.

SUMMARY OF THE INVENTION

An object of the present invention is to provide a group of solar cell elements and a solar cell module low in cost, easy to manufacture, and high in reliability, and a production method thereof, overcoming the above problems.

A group of solar cell elements according to the present invention is obtained by connecting a plurality of solar cell elements in series or in parallel by metal foil members, wherein an insulating tape is adhered in parallel with the metal foil members on and across the back surfaces of the plurality of solar cell elements arranged next to each other.

The group of solar cell elements according to the present invention is characterized in that the insulating tape comprises a base material selected from polyethylene terephthalate (PET), polycarbonate, and polypropylene.

Further, a solar cell module according to the present invention is characterized in that the group of solar cell elements is covered with an organic polymeric resin.

Further, a method for producing a solar cell module according to the present invention comprises a step of arranging a plurality of solar cell elements, a step of adhering an insulating tape on the plurality of solar cell elements, a step of connecting the plurality of solar cell elements in series or in parallel by metal foil members, and a step of covering the solar cell elements with a organic polymeric resin.

DETAILED DESCRIPTION OF THE PREFERRED EMBODIMENTS

The embodiments of the present invention will be explained.

Group of solar cell elements

Figure 2A:
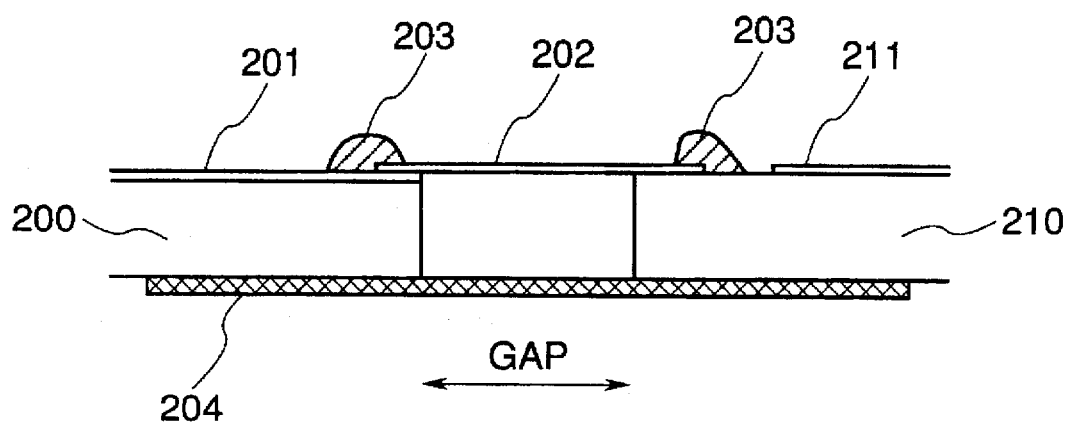
FIGS. 2A and 2B are schematic drawings showing a function of the connecting members of the present invention.
Figure 2B:
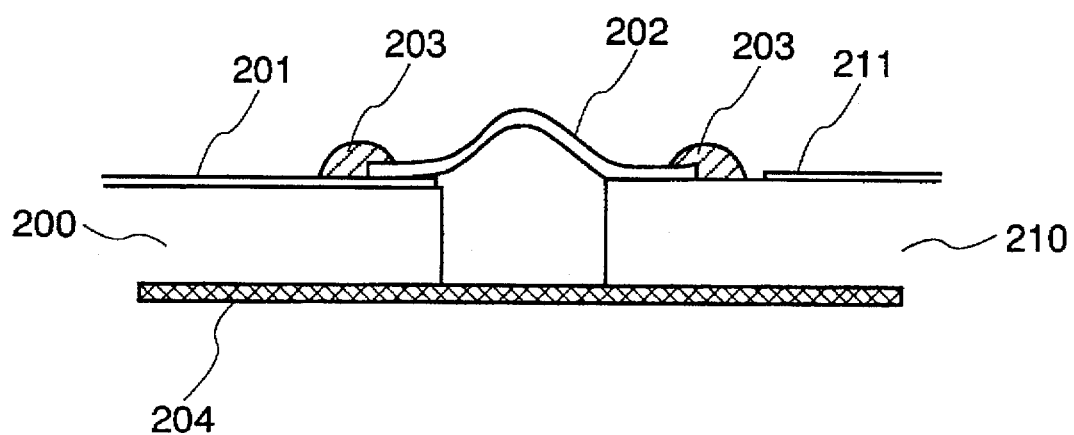

An example of a group of solar cell elements used in the present invention is shown in FIGS. 2A and 2B. FIGS. 2A and 2B show two solar cell elements adjacent to each other, connected by connecting members. FIG. 2A shows a state before lamination and FIG. 2B shows a state after lamination.

In FIG. 2A, solar cell elements 200 and 210 are positioned with a suitable gap in-between, and a collector electrode (upper electrode) 201 of solar cell element 200 is connected in series with the substrate side (lower electrode) of adjacent solar cell element 210 by connecting member 202 through solder 203. Insulating tape 204 is adhered to and across the back faces of the two solar cell elements. In this state, the connecting member 202 has a linear shape.

A solar cell module of the present invention means is one in which a group of solar cell elements as described above is covered with a polymeric organic resin. A specific example of a method for producing the solar cell module is one comprising placing a film of a polymeric organic resin over the entire group of solar cell elements (not shown) and heat-pressing them by a conventionally known method such as vacuum lamination. This method causes heat shrinkage of the insulating tape on the back faces, as shown in FIG. 2B, so as to narrow the gap and deform the connecting member 202 into a loop shape. This loop functions as a stress relief loop for relaxing various stresses such as tensile, compressive, and bending stresses, mainly loaded on the connecting member 202 in the solar cell module, and is very effective to improving mechanical reliability of the solar cell module.

Metal member

The material used for the connecting member 202 of the solar cell module of the present invention may be a metal, for example silver, copper, tin, zinc, or nickel, etc., taking into account three requirements of (1) good electrical conductivity, (2) feasibility of soldering, and (3) case of processing. However, without being limited to these, the metal member may be a metal foil member with a coat on the surface, for example such as silver plated copper or silver clad copper. The thickness of the member is preferably as thick as possible, considering the need for sufficient mechanical strength and the fact that the connecting members are portions through which an electric current flows, but is also preferably as thin as possible on the other hand from the need to decrease the thickness of the lamination. From a trade-off between the both, a specific range of the thickness is preferably between 70 and 200 μm.

Insulating tape

A variety of materials can be used for the insulating tape 204 employed in the present invention without any specific restriction: for example, acrylic, urethane, polyester, polyimide, vinyl chloride, silicone, fluorine, polyethylene, polypropylene, and glass cloth tapes, etc. However, the following two considerations should be taken into account: (1) use of a hard base material is preferable in order to decrease the stress exerted on the connecting members 202; (2) the tape needs to have long-term reliability since it is a packaging element of the solar cell module. Polyethylene terephthalate (PET) and polycarbonate are particularly preferred among the various resins.

Encapsulant structure

Figure 3:
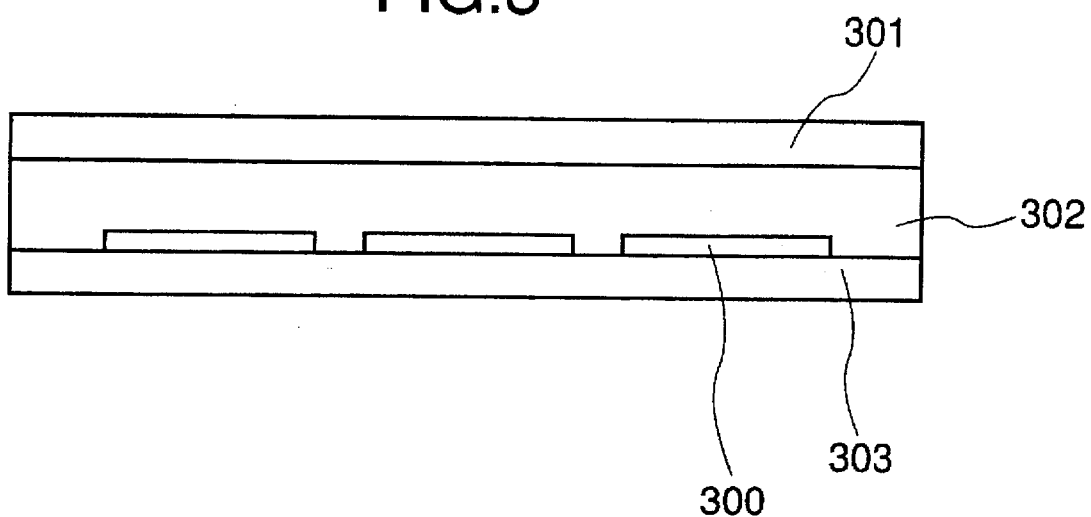
FIG. 3 is a schematic drawing showing a basic structure of a polymeric organic resin encapsulated solar cell module according to the present invention.

The polymeric organic resin encapsulant structure used in the present invention is, for example, the one shown in FIG. 3. The polymeric organic resin encapsulant system of FIG. 3 includes a topmost material 301, a top sealant 302, and a bottom sealant 303 surrounding solar cell elements 300.

Top sealant

The top sealant 302 used in the present invention is necessary for covering projections of solar cell elements with a resin, protecting the elements from the external environment including temperature changes, humidity, and impacts, and securing connection between the topmost material 301 and the solar cell elements 300. Accordingly, required properties of the top sealant 302 include weather resistance, adhesive property, filling property, heat resistance, freeze resistance, and impact resistance. Resins which meet these requirements are, for example, polyolefin resins such as ethylene-vinyl acetate copolymers (EVA), ethylene-methyl acrylate copolymers (EMA), ethylene ethyl acrylate copolymers (EEA), polyvinyl butyral resins, urethane resins, silicone resins, fluorine resins, etc. Among them, EVA can be preferably used because of its balanced physical properties for application to solar cell modules. However, untreated EVA has a low heat deformation temperature and will be easily deformed or crept under use at high temperatures. Thus, it is preferably crosslinked to raise the heat resistance.

Topmost material

Since the topmost material 301 employed in the present invention is located as an outermost layer of the solar cell module, it needs to have not only properties of weather resistance, stain resistance, and mechanical strength, but also properties for securing long-term reliability during outdoor exposure of the solar cell module. Examples of suitable materials in the present invention are fluoride resins and acrylic resins. Particularly, the fluoride resins can be preferably used because of excellent weather resistance and stain resistance thereof. More specifically, the fluoride resins include polyvinylidene fluoride resins, polyvinyl fluoride resins, and ethylene tetrafluoride-ethylene copolymers. Among them, the polyvinylidene fluoride resins are excellent in respect of weather resistance. Particularly, the ethylene tetrafluoride-ethylene copolymers are preferred because they have excellent weather resistance, mechanical strength, and transparency.

The topmost material 301 is not limited to resins. For example, glass or similar materials are suitable for use as the topmost material.

Bottom sealant

Preferred materials for the bottom sealant 303 used in the present invention are those that can provide sufficient adhesion to the substrate and have excellent long-term durability. Suitable materials include hot-melt materials such as EVA and polyvinyl butyral, double-sided tapes, and epoxy adhesives with flexibility. A reinforcing sheet may be adhered to the outside of the bottom sealant 303 in order to increase the mechanical strength of the solar cell module or in order to prevent strain and warping due to temperature change. Preferred examples of the reinforcing sheet are a steel plate, a plastic plate, and an FRP (glass-fiber-reinforced plastic) plate.

Method of heat pressing

The method of heat pressing employed in the present invention can be selected from a variety of conventionally known methods, for example vacuum lamination, roll lamination, etc.

Solar cell elements

Figure 4:
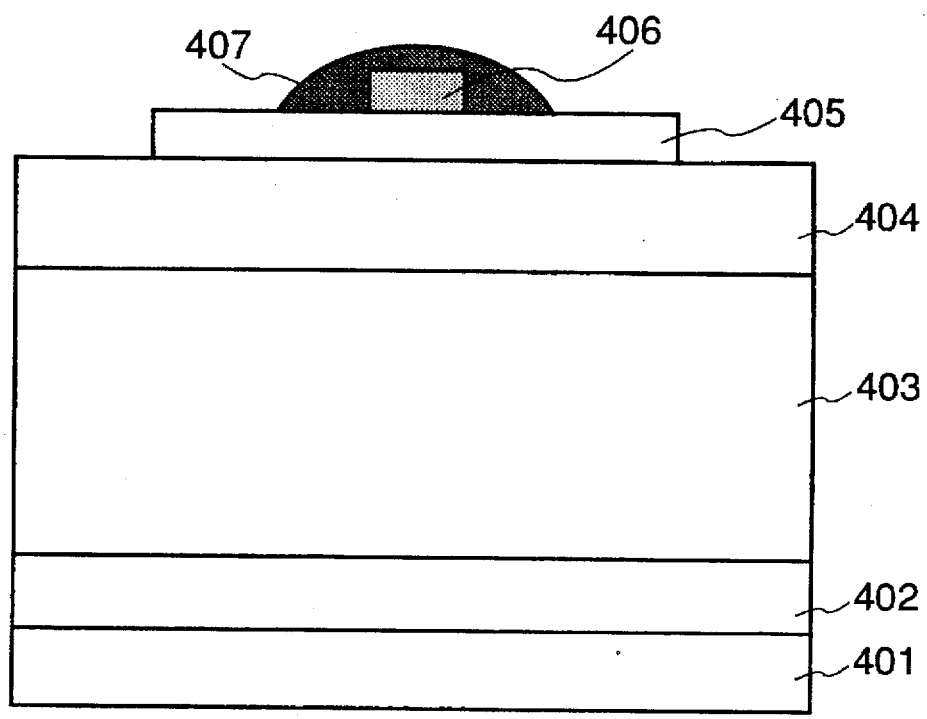
FIG. 4 is a schematic drawing of a unit solar cell element according to the present invention.

The solar cell elements (see FIG. 4) used in the present invention can be single crystal, polycrystalline, or amorphous silicon solar cells, and can also be solar cells using semiconductors other than silicon, and solar cells of a Schottky junction type. However, the following description concerns a representative example of an amorphous silicon solar cell.

Substrate

The substrate 401 used in the present invention is a member for mechanically supporting the semiconductor layer in the case of a thin-film type solar cell of amorphous silicon. Further, since the substrate is used also as an electrode in some cases, the substrate must have heat resistance so as to withstand high temperature upon formation of the semiconductor layer 403. The substrate may be electrically conductive or electrically insulating.

Specific examples of conductive materials include thin plates of metals such as Fe, Ni, Cr, Al, Mo, Au, Nb, Ta, V, Ti, Pt, and Pb or alloys thereof, for example brass or stainless steel, and composites thereof, carbon sheet, and galvanized sheet iron.

Further, specific examples of electrically insulating material include films or sheets of heat resistant synthetic resins such as polyethylene, polycarbonate, cellulose acetate, polypropylene, polyvinyl chloride, polyvinylidene chloride, polystyrene, polyamide, polyimide, and epoxy, or composites of those with glass fiber, carbon fiber, boron fiber, or metal fiber, those obtained by performing a surface coating treatment by sputtering, vapor deposition, plating, or the like of a metal conductive film and/or an insulating thin film of $SiO_2$, $Si_3N_4$, $Al_2O_3$, or AlN on the surface of a metal, a resin sheet, or the like, and glasses, ceramics, etc.

Lower electrode

The lower electrode 402 used in the present invention is provided for outputting the power generated in the semiconductor layer, and must be of a material having a work function which provides an ohmic contact to the semiconductor layer. Specific examples of the material for the lower electrode include metals or alloys thereof, such as Al, Ag, Pt, Au, Ni, Ti, Mo, Fe, V, Cr, Cu, stainless steel, brass, nichrome, and transparent conductive oxides (TCO), such as $SnO_2$, $In_2O_3$, ZnO, and ITO.

The surface of the lower electrode 402 is preferably flat, but may be texturized in order to cause diffuse reflection of light. If the substrate 401 is electrically conductive, the lower electrode 402 does not have to be provided.

The method for fabricating the lower electrode may be plating, vapor deposition, sputtering, etc.

Semiconductor layer

The semiconductor layer 403 used in the present invention can be of one of the known semiconductor materials normally used in thin-film solar cells. The semiconductor layer 403 in the solar cell element used in the present invention may be, for example, a pin junction amorphous silicon layer, a pn junction polycrystalline silicon layer, or a compound semiconductor heterojunction layer such as $CuInSe_2$/CdS.

In the case of the amorphous silicon layer, the method for forming the semiconductor layer 403 may be, for example, plasma CVD for generating plasma discharge in a starting gas for forming a film, such as silane gas. In the case of the pn junction polycrystalline silicon layer, the semiconductor layer is formed by a method for forming a film, for example, from fused silicon. In the case of $CuInSe_2$/CdS, the semiconductor layer is formed by electron beam evaporation, sputtering, or electrodeposition, etc.

Upper electrode

The upper electrode 404 used in the present invention is an electrode for outputting an electromotive force generated in the semiconductor layer, and is paired with the lower electrode 402. The upper electrode 404 is necessary when the semiconductor layer has a high sheet resistance, e.g. amorphous silicon, but is not necessary for crystalline solar cells because they have low sheet resistance. Since the upper electrode 404 is located on the light incident side, it must be transparent. Thus, the upper electrode 404 is also called a transparent electrode. The upper electrode 404 preferably has a transmittance of light of at least 85% for effective absorption of light in the semiconductor layer from the sun or a white fluorescent tube or the like. Further, from an electrical viewpoint, the upper electrode preferably has a sheet resistance of not more than 100 Ω/□ in order to allow electric current generated by the light flow in the lateral direction with respect to the semiconductor layer. Materials with such characteristics are metal oxides such as $SnO_2$, $In_2O_3$, ZnO, CdO, $CdSnO_4$, and ITO ($In_2O_3+SnO_2$).

Collector electrode

The collector electrode 405 used in the present invention is normally formed in a comb shape, and a suitable width and pitch thereof are determined from the values of sheet resistance of the semiconductor layer 403 and upper electrode 404. The collector electrode 405 must have a low electrical resistivity and not become a series resistance of the solar cell. A preferred electrical resistivity is in the range of $10^{-2}$ Ωcm to $10^{-6}$ Ωcm. The material for the collector electrode 405 may be selected, for example, from metals such as Ti, Cr, Mo, W, Al, Ag, Ni, Cu, Sn, and Pt, or alloys thereof or solders. Generally, a metal paste comprising metal powder and a polymer binder is used, but the material for the collector electrode is by no means limited to it.

Bus-bar electrode

The bus-bar electrode 406 used in the present invention is an electrode for collecting an electric current flowing in the collector electrode 405 to one end thereof. The material for the bus-bar electrode 406 may be selected from, for example, metals such as Ag, Pt, and Cu, and alloys thereof. The bus-bar electrode is formed by adhering a wire or foil of the material to the collector electrode. The foil is, for example, a copper foil or a tin-plated copper foil, which may be used with an adhesive in some cases. As for the place where the bus-bar electrode is located, the bus-bar electrode does not have to be located in the center of solar cell element, but may be located in the periphery of solar cell element.

Examples of the present invention will now be explained by referring to FIGS. 1A–1C to FIGS. 6A–6C.

EXAMPLE 1

Figure 1A:
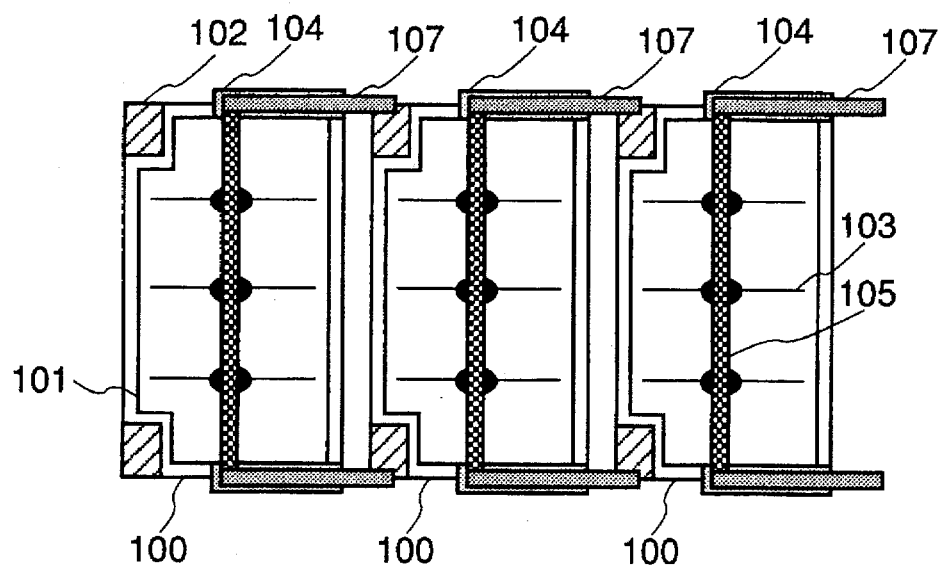
FIGS. 1A, 1B, and 1C are schematic drawings of a group of solar cell elements according to Example 1.
Figure 1B:
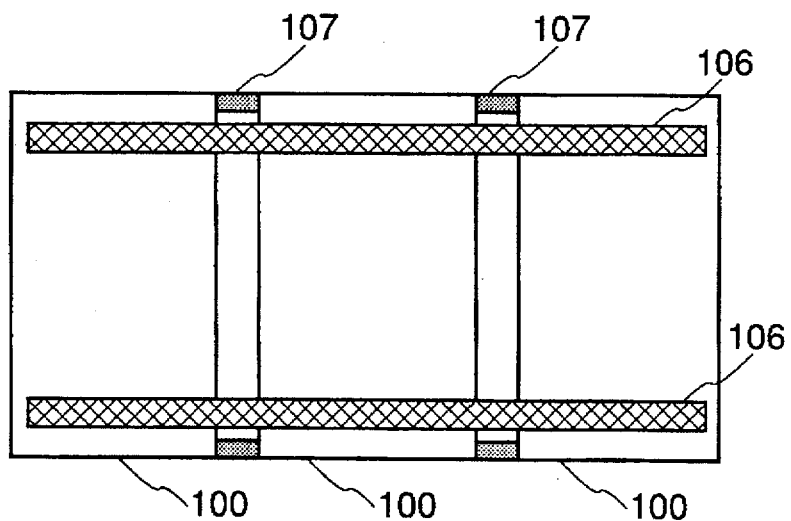
Figure 1C:
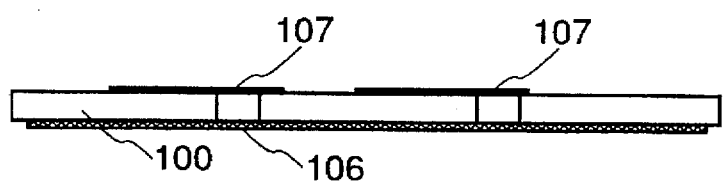

This example shows an amorphous silicon solar cell using a stainless steel substrate 102 as the substrate, which will be explained in detail referring to FIGS. 1A–1C. FIG. 1A is a schematic drawing of solar cell elements viewed from the light incident side, FIG. 1B a schematic drawing of the solar cell elements as viewed from the back side, and FIG. 1C a schematic drawing of the solar cell elements as viewed from the side.

A rolled stainless steel substrate made of a cleaned stainless steel foil having a thickness of 0.1 mm was first prepared as a substrate for the solar cell elements.

Next, a plurality of solar cell elements 100 were simultaneously formed on the surface of the stainless steel substrate 102. The solar cell elements 100 were of a structure including multilayered films as listed in Table 1.

TABLE 1

| Name/Thickness | Base surface | Forming method/Temp. | Material(s) used |
|---|---|---|---|
| Stainless steel substrate/ 0.1 mm | — | —/ | |
| ZnO film/ 500 nm | Stainless steel substrate | sputtering/ 350° C. | ZnO |
| n-type a-Si layer/15 nm | ZnO film | P-CVD/ 250° C. | $SiH_4$, $PH_3$, $H_2$ |
| i-type a-Si layer/ 400 nm | n-type a-Si layer | P-CVD/ 250° C. | $SiH_4$, $H_2$ |
| p-type a-Si layer/ 10 nm | i-type a-Si layer | P-CVD/ 250° C. | $SiH_4$, $BF_3$, $H_2$ |
| ITO layer/ 70 nm | p-type a-Si layer | Vapor deposition/ 200° C. | In, Sn, $O_2$ |

The rolled stainless steel substrate 102 with the above layers was then cut to produce ten unit solar cell elements 100 shown in FIG. 1A (which shows only three of them).

The solar cell elements 100 were then subjected to the following processes, thereby producing a group A of solar cell elements.

(1) A paste containing an etchant ($FeCl_3$) for ITO was printed by screen printing in the pattern shown by reference numeral 101 on the surface of each solar cell element 100, and thereafter the element was washed with pure water to remove a part of the ITO layer, thereby making sure of electrical separation between the upper electrode and the lower electrode.

(2) Each solar cell element 100 was abraded using a grinder to remove the ITO layer, the a-Si layers, and the lower electrode layer from a part of the non-effective power generation area and to expose the surface of stainless steel substrate 102, thereby forming lead-out portions from the lower electrode.

(3) The collector electrode 103 was formed in a thickness of 0.3 mm on the ITO layer by printing a silver paste on the ITO by screen printing and baking it in an oven.

(4) In order to make good electrical insulation between the bus-bar electrode 105 as described below and the lower electrode, a polyimide insulating tape 104 (of a thickness of 100 μm) was adhered on portions adjacent to the exposed surfaces of substrate.

(5) The individual solar cell elements were turned over, so that the ten solar cell elements were arranged at equal intervals with a gap of 1 mm between them. After that, as shown in FIG. 1B, two strips of polyethylene terephthalate (PET) tape 106 having a thickness of 100 μm were adhered to and across all ten elements in the series connection direction of the elements.

(6) Then the group of elements, on which the tape was adhered, was turned over, and connecting members 107 were cut from a copper foil of thickness 100 μm. The connecting members thus cut were placed as shown in FIG. 1A, and thereafter soldering was carried out for each member at an intersecting portion with the bus-bar electrode 105 and an intersecting portion with the exposed portion of the lower electrode 102 of an adjacent element to effect electrical connection between them.

As described above, the insulating tape 106 was adhered to the solar cell elements 100 before series connection thereof so as to positionally fix the elements, whereby the elements were able to be connected with good working efficiency and accuracy without movement of elements upon series connection. After completion of these sequential steps, the group of solar cell elements must be turned over in order to route the output terminals to the back side. Since the group of elements was positionally fixed by the PET tape adhered thereon, the group was able to be easily turned over without bending or deformation of the metal foil members and without contact between the elements.

The provision of the insulating tape 106 on the back faces as described above facilitates handling and improves the yield in producing solar cells.

COMPARATIVE EXAMPLE 1

This example is different from Example 1 only in that a group of solar cell elements B was produced without adhering the insulating tape 106 of PET thereon.

The other processing steps were the same as in Example 1.

Since in this example the positions of the elements were not fixed upon electrical connection by the series connecting members, different from Example 1, a considerable time was required for connecting the elements with an accurate gap of 1 mm between each of them.

After completion of series connection between the solar cell elements, turnover of the elements was carried out in order to attach final output terminals thereto. During the operation of series connection of ten solar cell elements, the metal members near the center were bent, which extremely lowered the flatness of the group of solar cell elements. Further, when the group was again turned over after forming the output terminals, peeling off of the bus-bar electrode 105 from the associated element was frequently observed in the elements near the center.

Thus, it was found that the yield was significantly lowered in the example without the insulating tape 106.

EXAMPLE 2

In this example, the group of solar cell elements A in Example 1 was covered with an EVA sheet etc. to produce a solar cell module A. The following describes the method of covering.

(1) On the light-incident surface side of the solar cell group there were layered in order (i) an EVA sheet (trade name Photocap and available in a thickness of 460 82 m from Springborn Laboratories Inc.); and (ii) a uniaxial oriented ETFE film, one surface of which was subjected to a corona discharge treatment (trade name Tefzel T2 film and available in a thickness of 38 µm from Dupont, Inc.).

(2) On the non-light-receiving surface side of the solar cell group opposite to the light-receiving surface there were layered in order (i) an EVA sheet (trade name Photocap and available in a thickness of 460 µm from Springborn Laboratories Inc.); (ii) a nylon film (trade name Durtec and available in a thickness of 63.5 µm from Dupont Inc.); and (iii) Galvalume with black coating (galvanized iron sheet, thickness 0.27 mm).

(3) From the above steps (1) and (2), a laminate was formed having a structure of ETFE/EVA/group of solar cell elements/EVA/nylon/EVA/iron sheet, and thereafter this laminate was heated at 150° C. for 30 minutes with evacuation under pressure using a vacuum laminate apparatus, thereby obtaining a solar cell module A.

The EVA sheet used herein was one widely used as a solar cell sealant, in which 1.5 parts by weight of a crosslinking agent, 0.3 part by weight of an ultraviolet absorber, 0.1 part by weight of a photo stabilizer, 0.2 part by weight of an anti-oxidant, and 0.25 part by weight of a silane coupling agent were blended with 100 parts by weight of an EVA resin (wherein the content of vinyl acetate was 33%).

The output terminals were preliminarily routed to the back side of the photovoltaic elements, and after lamination, output terminals were led out through ports preliminarily formed in the Galvalume, thus producing a solar cell module.

All other conditions were the same as in Example 1.

The appearance of the solar cell module A of this example was inspected, and it was found that the gaps between elements initially set at 1 mm were measured to be about 0.7 mm. It was also observed that there were fine rises of the surface near the series connection members. From this, it was presumed that the PET tape contracted because of the heating upon lamination to narrow the gaps between the elements and to form loops in the series members.

Figure 5:
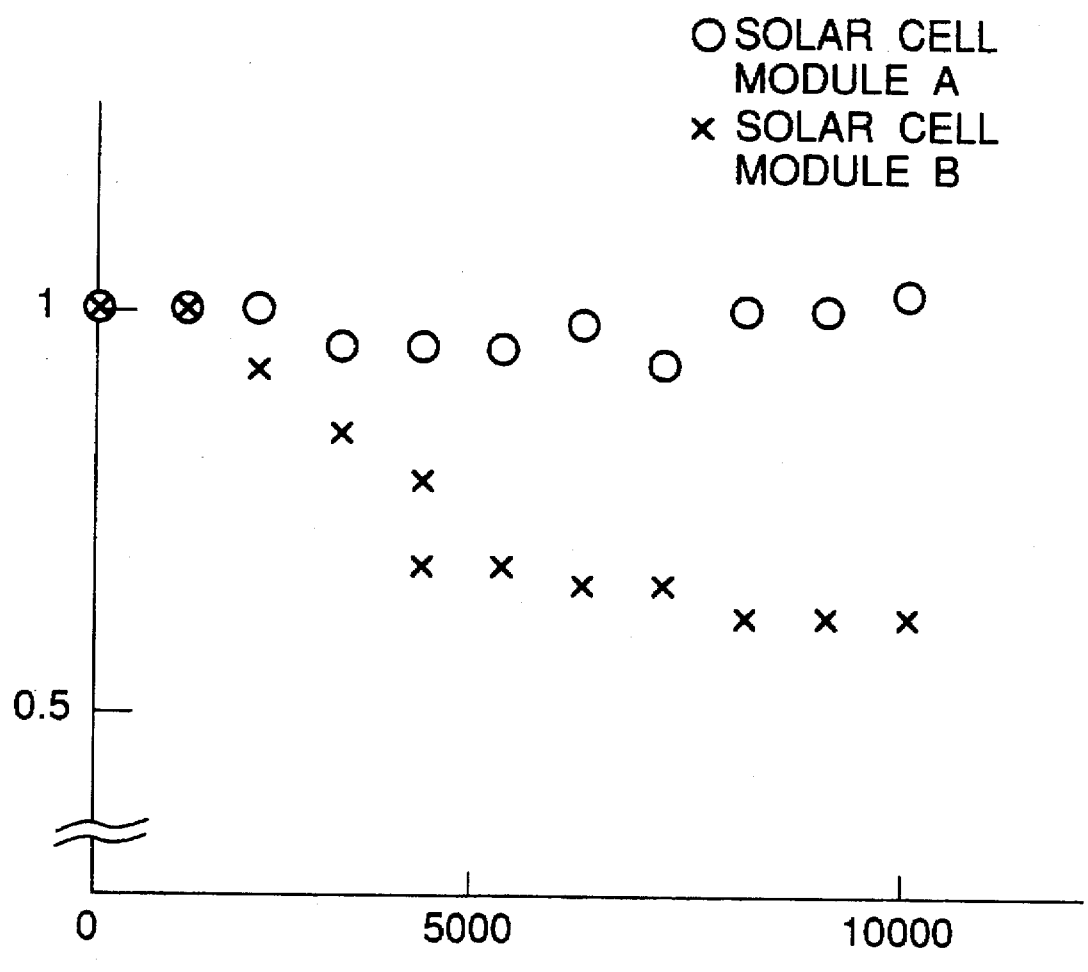
FIG. 5 is a graph showing the relation between the number of repeated bending cycles and conversion efficiency of solar cell modules according to Example 2 and Comparative Example 2.

The solar cell module A in this example was subjected to a test of repeated bending cycles. The repeated bending cycles test is a withstand load test according to the SERI standard, and the test included 10,000 cycles. During the test, inspection of appearance and check of conversion efficiency were performed every 1,000 cycles. FIG. 5 is a graph showing the relation between conversion efficiency and repeated bending cycles. The ordinate represents the conversion efficiency, as normalized to a numerical value before the repeated bending cycles test. The test results showed that the solar cell module A of the present example had little change in appearance and conversion efficiency after 10,000 cycles.

COMPARATIVE EXAMPLE 2

This example is different from Example 2 only in that the group of solar cell elements B in Comparative Example 1 was covered with the EVA sheet etc., thus producing a solar cell module B.

The other process conditions were the same as in Example 2.

The appearance of the solar cell module B of this example was inspected. There was no change in the gaps between the elements, which had been set to 1 mm, and there was no rise of the surface observed near the series connection members where the rises were observed in Example 2 (solar cell module A).

The solar cell module B of this example was also subjected to the same test of repeated bending cycles as in Example 2. The test results showed that the solar cell module B of this example started decreasing in conversion efficiency at 2,000 cycles. A drop of about 30% of the initial value was observed at about 4,000 cycles, and in addition cracks were visually observed in the series connection members near the centers thereof.

Accordingly, the results of Example 2 and Comparative Example 2 confirmed that the series connection members formed stress relief loops through provision of the insulating tape on the back surfaces of the solar cell elements during the covering step with the polymeric organic resin and that the loops functioned as loops for relaxing stress against bending of the solar cell module.

EXAMPLE 3

Figure 6A:
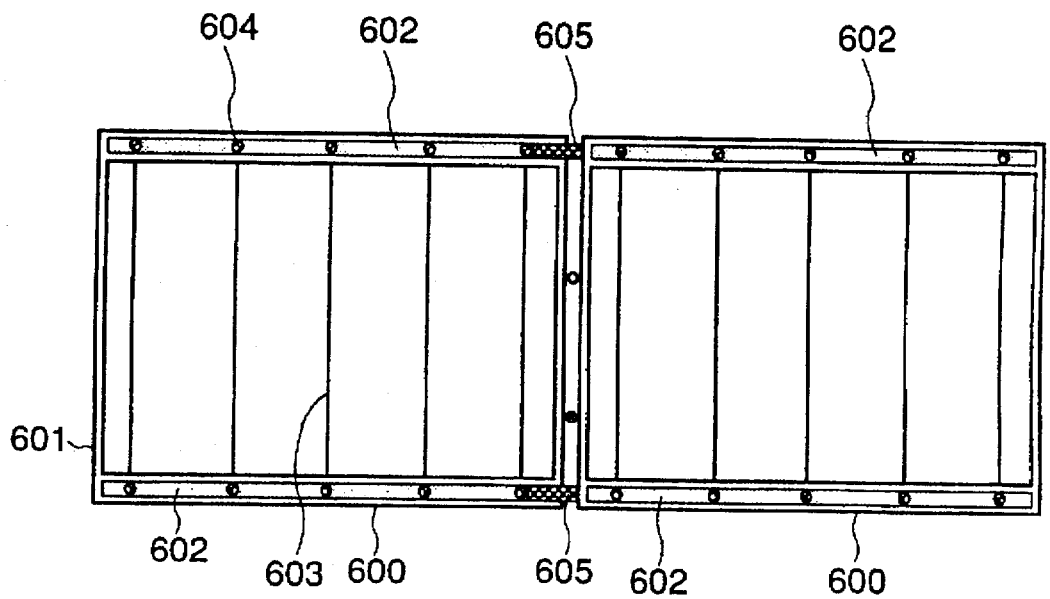
FIGS. 6A to 6C are schematic drawings of a solar cell module according to Example 3.
Figure 6B:
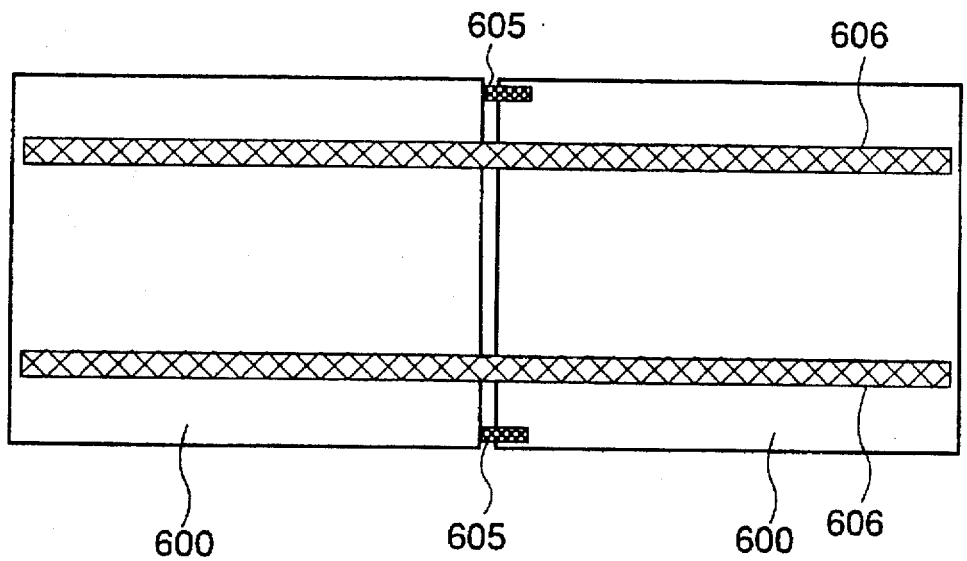
Figure 6C:
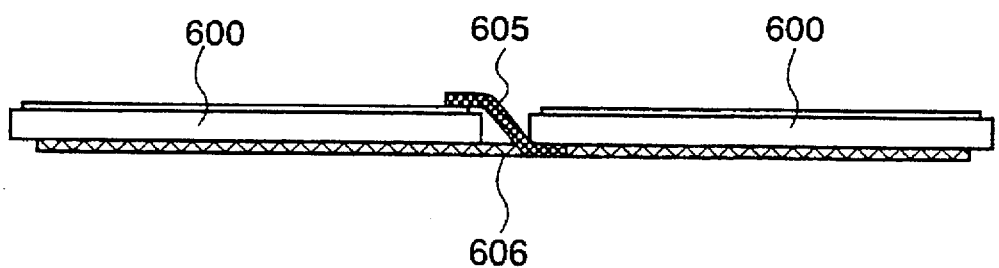
Figure 7A:
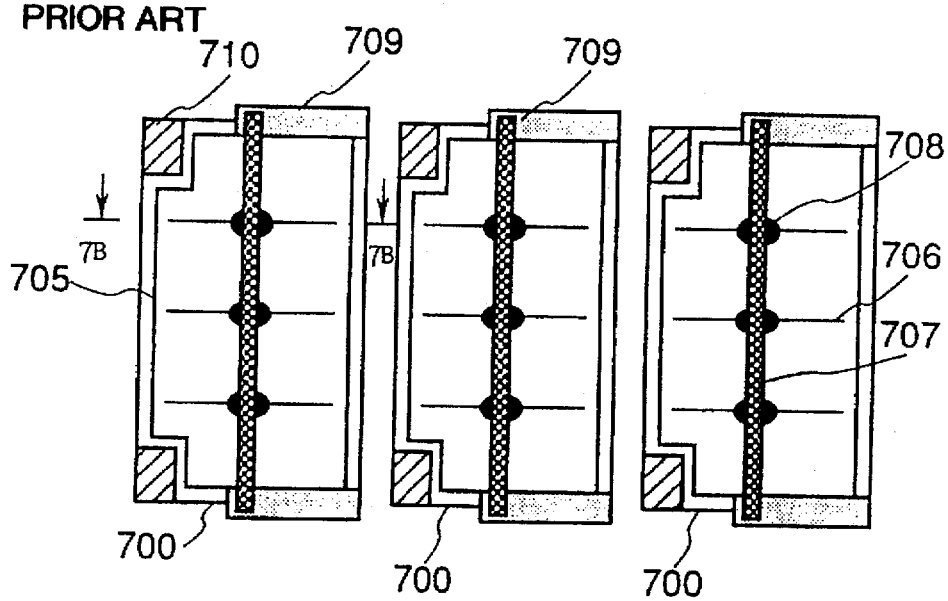
FIGS. 7A to 7C are schematic drawings of a conventional solar cell module and solar cell element.
Figure 7B:
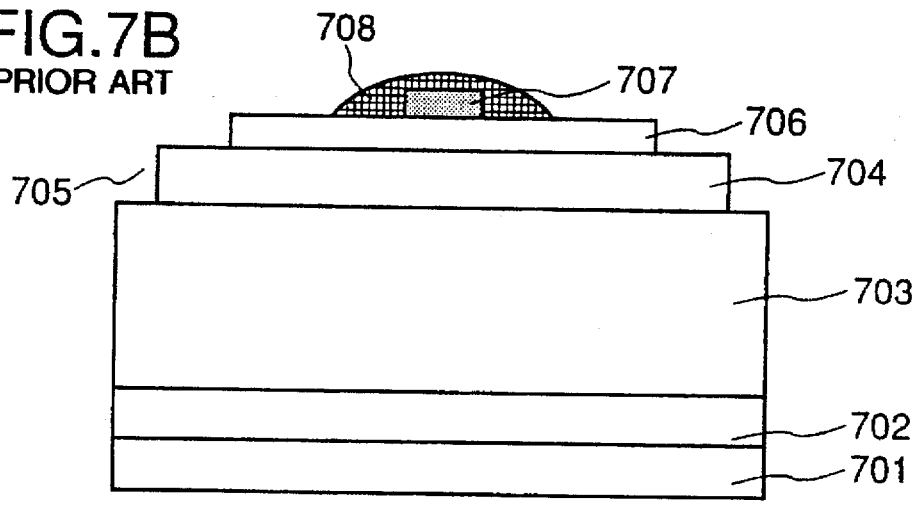
Figure 7C:
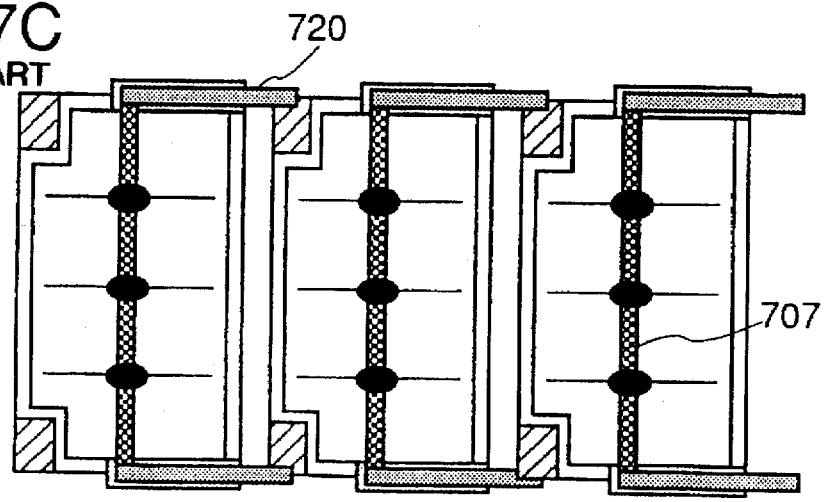

In this example, the collector electrodes made of the silver paste in Example 1 were replaced by copper wires, thereby producing a group of solar cell elements C. Next explained while referring to FIGS. 6A–6C is a method for producing the group of solar cell elements C according to the present invention. The solar cell element 600 shown in FIGS. 6A–6C has exactly the same multilayered films as the solar cell element 100 in Example 1. Although the drawings show only two solar cell elements, five elements were actually prepared.

(a) A paste containing an etchant ($FeCl_3$) for ITO was printed in the pattern indicated by reference numeral 601 by screen printing on the surface of each solar cell element 600, and thereafter it was washed with pure water to remove parts of the ITO layer, thereby ensuring electrical separation between the upper electrode and the lower electrode.

(b) A polyimide insulating tape of 70 µm thickness was adhered just outside the etched region (not shown), and a copper foil 602 of 100 µm thickness was further adhered through a double-sided tape on the insulating tape. At this stage the copper foil 602 is in an electrically floating state.

(c) A copper wire having a diameter of 100 µm was coated with a commercially available carbon paste, in a thickness of 20 µm, and thereafter the coating was dried to prepare a carbon coated wire. A plurality of these wires were placed as shown in FIG. 6A and pressed at 150° C. for 20 seconds by applying one atmospheric pressure so as to be bonded to the active region of the solar cell element, thereby forming the collector electrodes 603.

(d) Further, in order to make electrical connection sure between the copper foil 602 and the collector electrodes 603, a silver paste was applied in spot patterns 604 onto the surface of the collector electrodes 603 on the copper foil 602, and then was hardened in an oven. This enabled the copper foil 602 to become a lead-out electrode from the upper electrode.

(e) After that, rectangularly shaped metal foil members 605, which were produced by blanking a copper foil of 100 μm thickness with a die, were connected by soldering to the right side ends of the copper foil 602, as shown in FIG. 6A.

(f) Five solar cell elements produced by the above steps (a) to (e) were placed facing downward with a gap of 1 mm between elements, and two strips of PET tape were adhered thereon as shown in FIG. 6B. After the group of elements was arranged, the elements were connected in series by soldering the connecting members 605 to the stainless steel substrate on the back face of an adjacent element to thereby form a group of solar cell elements C.

The other process conditions were the same as those in Example 1.

The group of solar cell elements C completed up to the above step of (f) was subjected to the final operation of routing the output leads out from the back side, and with turning the element group over twice, the connecting members 605 experienced no bending at all and the operation was smoothly completed.

Further, the group of these solar cell elements C was covered exactly in the same manner as in Example 2, thus producing a solar cell module C with five solar cell elements connected in series. From inspection, it was confirmed that the gaps initially set to 1 mm were narrowed to about 0.8 mm. Further, fine rises of the surface were observed immediately above the series connecting members.

Further, the solar cell module C was subjected to the same repeated bending cycles test as in Example 2, which confirmed that the module had little change in appearance and conversion efficiency after 10,000 cycles.

COMPARATIVE EXAMPLE 3

This example is different from Example 3 only in that a group of solar cell elements D was produced without adhesion of the PET insulating tape.

The other process conditions were the same as in Example 3.

In this example, the interconnection of the series members took a considerable time, because the positions of the elements were not fixed as in Example 3.

The final operation of routing the output leads from the back side was carried out for the group of solar cell elements D after completion of series connection. After the group of elements was turned over twice, the metal interconnection members were bent just in the center where the five solar cell elements were connected in series, thus losing flatness of the solar cell element group.

Further, the solar cell module C of this example was inspected. There was no change observed in the gaps between the elements, initially set at 1 mm, and no rise of the surface of the series interconnection member was observed, as was observed in Example 3 (solar cell module C). The repeated bending cycles was carried out, and the conversion efficiency at 1,000 cycles was lowered to about half of the initial value. Upon checking the appearance of the module after the test, rupture was observed in the portions which had been bent upon series connection.

Accordingly, the results of Example 3 and Comparative Example 3 confirmed that, also in the case where the series members were formed between the top and the bottom of adjacent elements, stress loops were formed in the metal foil members because of contraction of the tape, thereby producing a module with high mechanical reliability and improving the yield.

The same results as for Example 3 and Comparative Example 3 as described above were also obtained when a polyimide insulating tape of 25 μm thickness was used instead of the PET tape.

As explained above, the present invention can improve the efficiency and yield in producing a group of solar cell elements. Also, the present invention can provide the solar cell module with high reliability and stability.

In the present invention, the insulating tape is adhered to and across the plurality of solar cell elements to be connected and both the tape and the connecting members (metal foil members) can receive the stress exerted upon handling the group of connected solar cell elements, which decreases the stress exerted on the connecting members compared to the conventional examples.

As a result, the connecting members are rarely bent and thus, no crease is formed in the connecting members. A decrease in the stress on the connecting members can also decrease the stress transmitted to the bus-bar electrode, whereby the bus-bar electrode can be prevented from being peeled off.

Further, the insulating tape contracts because of heating upon lamination in the step of covering the group of solar cell elements with the polymeric organic resin in the lamination step, so that the connecting members can form stress loops which form a strong structure against repeated bending stress.

What is claimed is:

1. A group of solar cell elements obtained by electrically connecting a plurality of solar cell elements in series or in parallel by metal foil members, wherein at least one piece of insulating tape is adhered in parallel with the metal foil members on and across the back surfaces of the plurality of solar cell elements arranged next to each other.

2. The group of solar cell elements according to claim 1, wherein said at least one piece of insulating tape comprises a base material of resin selected from polyethylene terephthalate (PET) and polycarbonate.

3. A solar cell module in which the group of solar cell elements as set forth in claims 1 or 2 is covered with an organic polymeric resin.

4. A group of solar cell elements according to claim 1, wherein said at least one piece of insulating tape is heat shrinkable.

5. A method for producing a solar cell module, comprising:

a step of adjacently arranging a plurality of solar cell elements, a step of connecting said plurality of solar cell elements in series or in parallel by metal foil members, a step of adhering at least one piece of insulating tape on back surfaces of the plurality of solar cell elements with the metal foil members, and a step of covering the solar cell elements with an organic polymeric resin.

6. The method according to claim 5, wherein the step of adhering the insulating tape is conducted employing at least one elongated strip of heat shrinkable insulating tape on the back surfaces of the plurality of the solar cell elements in parallel with the metal foil members and wherein heat sufficient to shrink said heat shrinkable tape is employed.

7. A solar cell element arrangement comprising a plurality of solar cell elements each having a back side composed of a conductive member, a front side having a transparent member provided thereon, and wherein said plurality of solar cell elements are arranged with a gap between adjacent solar cell elements and connected in series or in parallel, and an insulating tape for connecting the gap(s) is adhered on the conductive member(s) and across the back surfaces of the adjacent elements.

8. A solar cell element arrangement according to claim 7, wherein said insulating tape is heat shrinkable.

9. A solar cell element arrangement according to claim 7, wherein said insulating tape is a strip of heat shrinkable insulating tape.

10. A solar cell element arrangement according to claim 9, wherein said insulating tape comprises a plurality of heat shrinkable insulating tape strips.

11. A solar cell element arrangement according to claim 7, wherein said conductive member of the back side is an electrode made of metal.

12. A solar cell module comprising:

a) a solar cell element arrangement comprising a plurality of solar cell elements each having a back side composed of a conductive member, a front side of said module having a transparent member provided thereon, and wherein said plurality of solar cell elements are arranged with a gap between adjacent solar cell elements and connected in series or in parallel, and an insulating tape for connecting the gap(s) is adhered on the conductive member(s) at the back side and across the back surfaces of the adjacent elements;

b) a back side sealing member for sealing said solar cell element arrangement; and c) a strengthening plate provided on the back side of said sealing member.

13. A solar cell module according to claim 12, wherein said strengthening plate is selected from the group consisting of steel plate, plastic plate, and glass fiber reinforced plastic plate.

\* \* \* \* \*

UNITED STATES PATENT AND TRADEMARK OFFICE
CERTIFICATE OF CORRECTION

PATENT NO. : 5,679,176

DATED : October 21, 1997

INVENTOR(S): KOJI TSUZUKI ET AL.

It is certified that error appears in the above-identified patent and that said Letters Patent is hereby corrected as shown below:

COLUMN 3
 Line 12, "a" should read --an--.

COLUMN 4
 Line 11, "case" should read --ease--.

COLUMN 7, TABLE 1
 Line 49, "mn" should read --nm--.

COLUMN 9
 Line 20, "82 m" should read --$\mu$m--.

COLUMN 11
 Line 63, "was" should read --were--.

Signed and Sealed this

Twenty-first Day of April, 1998

Attest:

BRUCE LEHMAN

*Attesting Officer*    *Commissioner of Patents and Trademarks*